United States Patent
Lee et al.

(10) Patent No.: US 8,422,760 B2
(45) Date of Patent: Apr. 16, 2013

(54) SYSTEM FOR MONITORING HAZE OF A PHOTOMASK

(75) Inventors: Dong-gun Lee, Hwaseong-si (KR); Seong-sue Kim, Seoul (KR); Jae-Hyuck Choi, Yongin-si (KR); Jin-sik Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 692 days.

(21) Appl. No.: 12/588,490

(22) Filed: Oct. 16, 2009

(65) Prior Publication Data
US 2010/0111402 A1    May 6, 2010

(30) Foreign Application Priority Data
Oct. 17, 2008 (KR) .................. 10-2008-0102143

(51) Int. Cl.
*G06K 9/00* (2006.01)

(52) U.S. Cl.
USPC .................. 382/145; 382/144; 356/237.4

(58) Field of Classification Search .......... 382/141–154, 382/100; 356/237.1–237.5
See application file for complete search history.

(56) References Cited

U.S. PATENT DOCUMENTS

| | | | |
|---|---|---|---|
| 2007/0236691 A1* | 10/2007 | Fukuhara et al. | 356/237.6 |
| 2008/0310703 A1* | 12/2008 | Yang et al. | 382/144 |
| 2009/0066942 A1* | 3/2009 | Mangan et al. | 356/237.5 |
| 2011/0101226 A1* | 5/2011 | Ben-Zvi et al. | 250/358.1 |

FOREIGN PATENT DOCUMENTS

| | | |
|---|---|---|
| JP | 2007-271425 A | 10/2007 |
| KR | 10-2006-0085263 A | 7/2006 |
| KR | 10-0793085 B1 | 1/2008 |
| WO | WO 2008/075841 A1 | 6/2008 |

* cited by examiner

*Primary Examiner* — Hoa Pham
(74) *Attorney, Agent, or Firm* — Lee & Morse, P.C.

(57) ABSTRACT

A system for monitoring haze of a photomask includes an installation unit in which a photomask is mounted, a light emission unit emitting a light beam to the photomask installed on the installation unit, a detection unit detecting a diffraction pattern of the light beam emitted by the light emission unit and passed through the photomask, and an analysis unit analyzing the diffraction pattern detected by the detection unit.

20 Claims, 6 Drawing Sheets

LB  HP  DP

SYSTEM FOR MONITORING HAZE OF A PHOTOMASK

BACKGROUND

1. Field

Embodiments relate to a photomask used for the manufacture of a semiconductor device and, more particularly, to a system for monitoring haze generated in a photomask.

2. Description of the Related Art

In a semiconductor process, the wavelength of a light source used in a lithography process may be decreased in order to improve resolution of a pattern and increase the degree of integration of a semiconductor device. Accordingly, a photomask may exhibit a growth defect, i.e., haze, where such haze, at longer wavelengths, had not been a problem. The haze may affect transmissivity of light through the photomask during light exposure so that the amount of exposure energy arriving at a wafer is changed. Such deviations may result in defects in the resulting semiconductor device, reducing process yields.

SUMMARY

Embodiments are directed to a system for monitoring haze of photomask, which substantially overcome one or more problems due to the limitations and disadvantages of the related art.

It is therefore a feature of an embodiment to provide a system for monitoring haze of photomask that may prevent or reduce generation of haze in advance in the semiconductor manufacturing process.

At least one of the above and other features and advantages may be realized by providing a system for monitoring haze of a photomask, the system includes an installation unit installing a photomask, a light emission unit emitting a light beam to the photomask installed on the installation unit, a detection unit detecting a diffraction pattern of the light beam emitted by the light emission unit and passed through the photomask, and an analysis unit analyzing the diffraction pattern detected by the detection unit.

The analysis unit may continuously analyze in real time for haze information with respect to the photomask through which the light beam emitted by the light emission unit passes.

The system further may include a light focusing unit arranged between the photomask installed on the installation unit and the light emission unit, the light focusing unit focuses the light beam emitted by the light emission unit.

The system may further include an attenuation unit arranged between the photomask installed on the installation unit and the detection unit, the attenuation unit attenuates the light beam emitted by the light emission unit.

The system may further include a blocking unit arranged between the photomask installed on the installation unit and the detection unit, the blocking unit blocks a $0^{th}$ order diffraction light ray of a diffraction light beam formed as the light beam and passes through the photomask.

The blocking unit may be closer to the detection unit than an attenuation unit or may be farther to the detection unit than the attenuation unit.

The haze information may include the density, location of haze generation, or time of haze generation on the photomask installed on the installation unit.

The analysis unit may include a first storage unit storing a comparative diffraction pattern, a second storage unit storing a diffraction pattern detected by the detection unit, and an operation unit analyzing the haze information by comparing the comparative diffraction pattern stored in the first storage unit and the diffraction pattern stored in the second storage unit.

The comparative diffraction pattern may be data about a mask pattern formed at the photomask installed on the installation unit or simulation data of a diffraction pattern by the mask pattern.

The comparative diffraction pattern may be an initially detected data of a diffraction pattern before haze is generated.

The operation unit may compare the comparative diffraction pattern and the diffraction pattern detected by the detection unit to analyze for the haze information in an iteration method using fast Fourier transform (FFT) and inverse fast Fourier transform ($FFT^{-1}$).

The analysis unit may perform a real time analysis of the diffraction pattern detected by the detection unit.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
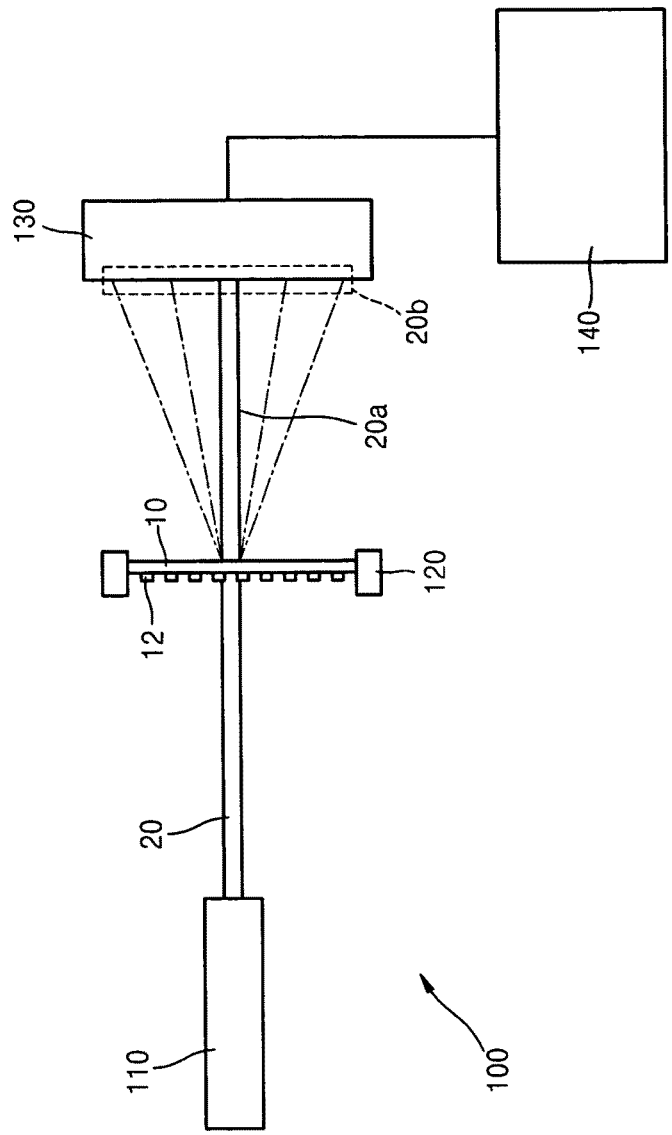
FIG. 1 illustrates a system for monitoring haze of a photomask according to an exemplary embodiment.

Korean Patent Application No. 10-2008-0102143, filed on Oct. 17, 2008, in the Korean Intellectual Property Office, and entitled: "System for Monitoring Haze of Photomask," is incorporated by reference herein in its entirety.

The system for monitoring haze of a photomask according to exemplary embodiments is described in detail with reference to the accompanying drawings. However, the present embodiments are not limited thereto and it will be understood that various changes in form and details may be made therein without departing from the spirit and scope of the following claims. That is, descriptions on particular structures or functions may be presented merely for explaining exemplary embodiments.

The terms such as "first" and "second" are used herein merely to describe a variety of constituent elements, but the constituent elements are not limited by the terms. The terms are used only for the purpose of distinguishing one constituent element from another constituent element. For example, without departing from the right scope of the present inventive concept, a first constituent element may be referred to as a second constituent element, and vice versa.

In the present specification, when a constituent element "connects" or is "connected" to another constituent element, the constituent element contacts or is connected to the other constituent element directly or through at least one of other constituent elements. Conversely, when a constituent element is described to "directly connect" or to be "directly connected" to another constituent element, the constituent element should be construed to be directly connected to another constituent element without any other constituent element interposed therebetween. Other expressions, such as, "between" or "directly between," describing the relationship between the constituent elements, may be construed in the same manner.

The terms in the present specification are used for explaining a specific exemplary embodiment, not limiting the present embodiments. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those skilled in the art to which the present inventive concept may pertain. The terms as those defined in generally used dictionaries are construed to have meanings matching that in the context of related technology and, unless clearly defined otherwise, are not construed to be ideally or excessively formal.

FIG. 1 illustrates a system 100 for monitoring haze of a photomask according to an exemplary embodiment. Referring to FIG. 1, the haze monitoring system 100 may include an installation unit 120 mounting a photomask 10, a light emission unit 110 emitting a light beam, a detection unit 130 detecting a diffraction pattern, and an analysis unit 140 analyzing a detected diffraction pattern.

The light emission unit 110 may emit a light beam 20 having a wavelength corresponding to that of a light source used in a lithography process. The light emission unit 110 may emit the light beam 20 having a wavelength, e.g., about 10 nm to about 300 nm. The light emission unit 110 may be a deep ultraviolet (DUV) light source, e.g., an ArF (193 nm) or KrF (248 nm) excimer laser, or an extreme ultraviolet (EUV) light source. The light emission unit 110 may be on an opposite side of the detection unit 130 with respect to the installation unit 120.

The installation unit 120 may fixedly install the photomask 10 used in a lithography process. The wavelength of the light beam 20 emitted by the light emission unit 110 may pass through the photomask 10. A mask pattern 12 suitable for the lithography process may be formed on the photomask 10, e.g., on a side facing the light emission unit 110. The photomask 10 may be a mask for, e.g., a DUV or EUV lithography process.

The light beam 20 may transmit a diffractive pattern through the photomask 10 installed on the installation unit 120. The light beam 20 may be diffracted by passing through the mask pattern 12 of the photomask 10 so that a diffractive pattern 20b, including $0^{th}$ order diffraction light 20a, may be formed on the detection unit 130. The detection unit 130 may further include an image sensor (not illustrated) detecting the diffractive pattern 20b. The detection unit 130 may be formed of, e.g., a charge coupled device (CCD).

The diffractive pattern 20b detected by the detection unit 130 may be transmitted to the analysis unit 140 and analyzed for haze information. The haze information may include a variety of parameters, e.g., the density $\rho$, distribution and position, or generation time, of haze generated on the photomask 10.

All materials forming the photomask 10, residue after cleaning the photomask 10, residue generated in the process, a pellicle itself and an adhesive used for the pellicle, attachment or detachment of a reticle material, a reticle container, a stepper/scanner, and an atmospheric material for a fab itself may be reasons for the generation of haze on a surface of the photomask 10. The residue may be first generated on a surface of the photomask 10 as a particle contaminant having a unit molecule size. As the exposure energy increases, the residue may generate a sort of an opto-chemical reaction during the exposure to have a crystal growth. As the frequency of the photomask 10 usage increases, haze may be generated and grow due to an accumulated light exposure. As haze is generated and grown to be a size and distribution over a certain level, generated haze affects transmissivity of light during the exposure, and thus, the amount of the exposure energy arriving at a wafer may be changed.

When the lithography process is performed with a wavelength of an existing I-line (365 nm) or higher, the exposure energy may relatively decrease, so that the residue remaining on the surface of the photomask 10 may not generate the opto-chemical reaction. As the wavelength of a light source decreases, e.g., in the DUV lithography process using an ArF (193 nm) or KrF (248 nm) excimer laser, or the EUV (13.5 nm) lithography process, however, the exposure energy may increase. Thus, the residue remaining on the surface of the photomask 10 may generate the opto-chemical reaction, thereby generating a growth defect, i.e., haze.

Referring back to FIG. 1, the light emission unit 110 may emit the light beam 20 to the photomask 10 installed on the installation unit 120. Due to the mask pattern 12 formed on the photomask 10, the light beam 20 may be diffracted while passing through the photomask 10, and may be detected as the diffraction pattern 20b by the detection unit 130. When the light beam 20 is continuously emitted to pass through the photomask 10, haze may be generated on the photomask 10. When haze is generated, the diffraction pattern 20b may be changed. In detail, a diffraction pattern of the photomask 10 where haze is not generated and a diffraction pattern of the photomask 10 where haze is generated interfere with each other so that the diffraction pattern 20b may be changed. Thus, the haze information with respect to the photomask 10 may be obtained by the analysis unit 140 so that a change in the diffraction pattern 20b detected by the detection unit 130 may be continuously analyzed in real time.

The real-time analysis signifies an analysis of data detected by the detection unit 130 for a relatively short time without a delay at its maximum, during a haze monitoring process that takes a relatively long time, for example, several hours to tens of hours, not an analysis that is ideally performed in real time. Also, the continuous analysis signifies that the analysis is repeatedly performed for each of relatively short time periods during the relatively long haze monitoring process. Thus, the real-time continuous analysis may signify that an analysis is performed for several seconds to tens of seconds at an interval of tens of seconds to several minutes during the haze monitoring process performed for tens of hours.

The light beam 20 emitted by the light emission unit 110 may have the same wavelength as that of a light source used for the lithography process applicable to the photomask 10 installed on the installation unit 120. To accelerate the generation of haze, the intensity of the light beam 20 emitted by the light emission unit 110 may be increased, so that the intensity of the light beam 20 may be greater than that used for the lithography process applicable to the photomask 10 installed at the installation unit 120.

Figure 2:
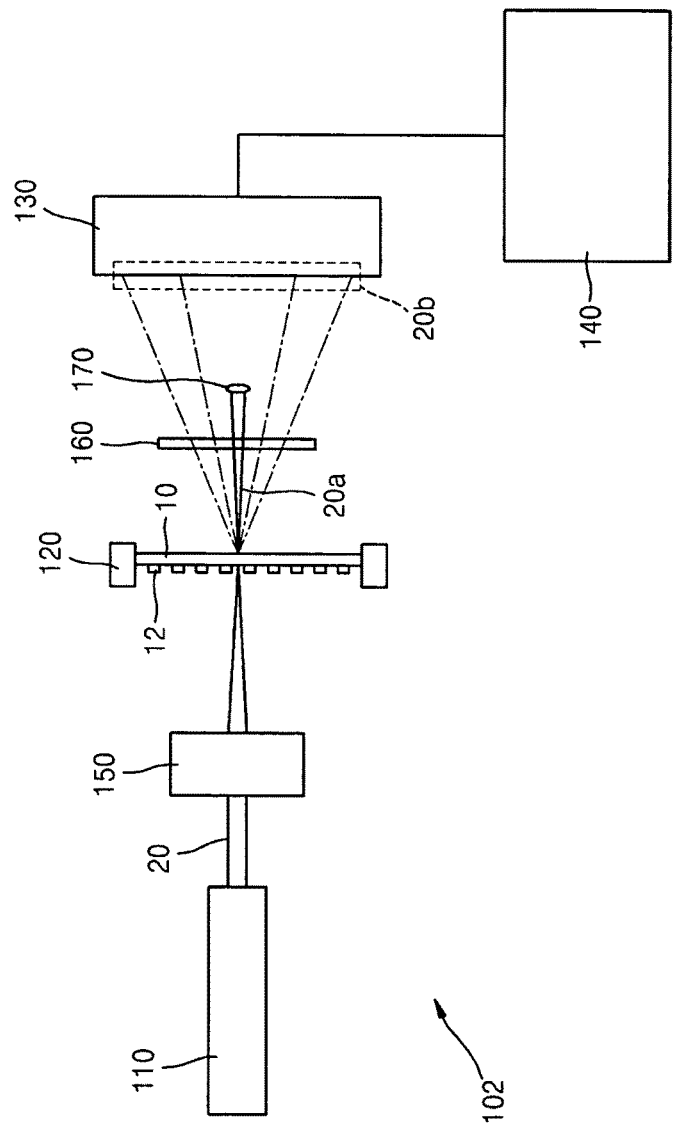
FIG. 2 illustrates a system for monitoring haze of a photomask according to another exemplary embodiment.

FIG. 2 illustrates a system 102 monitoring haze of a photomask according to another exemplary embodiment. Referring to FIG. 2, the system 102 may further include a light focusing unit 150, an attenuation unit 160, or a blocking unit 170 in addition to the constituent elements of the system 100 of FIG. 1. Thus, a detailed description of the same components as those of FIG. 1 will not be repeated.

The light focusing unit 150 may be arranged between the light emission unit 110 and the photomask 10 installed on the installation unit 120 to focus the light beam 20 emitted by the light emission unit 110 to the photomask 10 installed on the installation unit 120. The light focusing unit 150 may be separated from the light emission unit 110 by a predetermined distance. The light focusing unit 150 may include typical optical devices, e.g., lenses, mirrors, or electromagnetic devices. The light focusing unit 150 may focus the light beam 20 emitted by the light emission unit 110 to a diameter of about 10 μm to about 10 mm when the light beam 20 pass through the photomask 10. When the light beam 20 emitted by the light emission unit 110 is focused by the light focusing unit 150, the generation of haze may be further accelerated.

The attenuation unit 160 may be arranged between the photomask 10 installed on the installation unit 120 and the detection unit 130. The attenuation unit 160 may weaken the intensity of the light beam 20 passed through the photomask 10, so that the intensity of the diffraction pattern 20b of the light beam 20 reaching the detection unit 130 may be weaker than when it just passed through the photomask 10. As described above, the light beam 20 emitted by the light emission unit 110 and focused by the light focusing unit 150 may have a relatively large intensity to accelerate the generation of haze. When the intensity of the light beam 20 is large, the detection unit 130 may be damaged. Thus, considering the characteristic of a light detection device, e.g., a CCD, in the detection unit 130, the attenuation unit 160 may reduce the intensity of the light beam 20 so that the light beam 20 reaching the detection unit 130 after passing through the photomask 10 would be not so intense as to damage the detection unit 130.

The blocking unit 170 may block the $0^{th}$ order diffraction light 20a of a diffraction light beam formed as the light beam 20 passes through the photomask 10. Since the $0^{th}$ order diffraction light 20a includes a component that is not diffracted among the light beam 20 emitted by the light emission unit 110, a diffraction component input with the $0^{th}$ order diffraction light ray 20a may actually be undetectable. Further, since the $0^{th}$ order diffraction light ray 20a has the largest intensity of all diffraction orders, it may be difficult for the detection unit 130 to detect other diffraction orders around the $0^{th}$ order diffraction light 20a. The position and diameter of the blocking unit 170 may be determined based on the diameter of the light beam 20 emitted by the light emission unit 110 or a degree of focusing done by the light focusing unit 150. The attenuation unit 160 and the blocking unit 170 may be arranged together or in sequence as illustrated in FIG. 2, or in the reverse sequence, i.e., the attenuation unit 160 may be closer to the detection unit 130 than the blocking unit 170.

Figure 3:
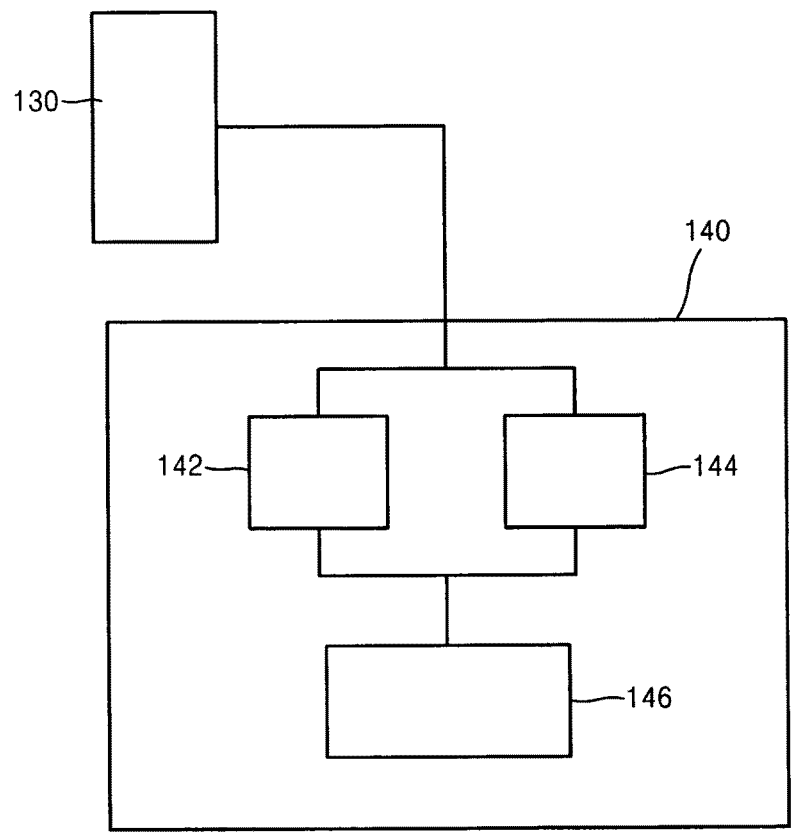
FIG. 3 illustrates a block diagram showing a structure of an analysis unit according to an exemplary embodiment.

FIG. 3 illustrates a block diagram showing the structure of the analysis unit 140 according to an exemplary embodiment. Referring to FIG. 3, the analysis unit 140 may continuously receive detection data of a diffraction pattern detected by the detection unit 130 in real time. The analysis unit 140 may include a first storage unit 142, a second storage unit 144, and an operation unit 146. The first storage unit 142 may store a comparative diffraction pattern. The second storage unit 144 may store a diffraction pattern subject to an actual analysis.

The analysis unit 140 may analyze the diffraction pattern, e.g., stored in the second storage unit 144, alone to obtain information about haze. The information about haze included in the diffraction pattern is apparent from variations in the diffraction pattern, not in the overall diffraction pattern. Thus, the haze information may be more quickly determined by comparing the detected diffraction pattern with a diffraction pattern that does not include the haze information than from the analysis of only the detected diffraction pattern itself.

The comparative diffraction pattern stored in the first storage unit 142 may be obtained through simulation using information about a photomask installed on a haze monitoring system, e.g., information about the mask pattern 12 formed on the photomask 10 to be used for monitoring haze. That is, the comparative diffraction pattern may be simulation data of a diffraction pattern obtained using the photomask 10. Alternatively, the comparative diffraction pattern may be an initial diffraction pattern of the diffraction patterns being continuously detected by the detection unit 130 for the haze monitoring. That is, the comparative diffraction pattern may be a diffraction pattern detected by the detection unit 130 before haze is generated.

The operation unit 146 may obtain the haze information by comparing and analyzing the comparative diffraction pattern stored in the first storage unit 142 and the detected diffraction pattern stored in the second storage unit 144 in real time. The first storage unit 142 may store information about the photomask 10 installed on the haze monitoring system, e.g., data about a mask pattern 12 formed on the photomask 10 for the haze monitoring.

Figure 4:
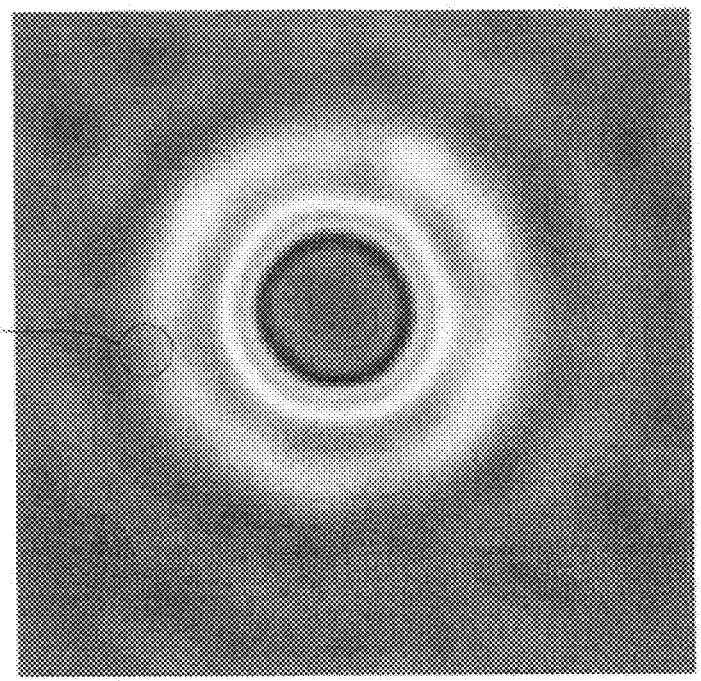
FIGS. 4 and 5 illustrate images showing diffraction patterns when haze is not generated and is generated, respectively, according to an exemplary embodiment.
Figure 5:
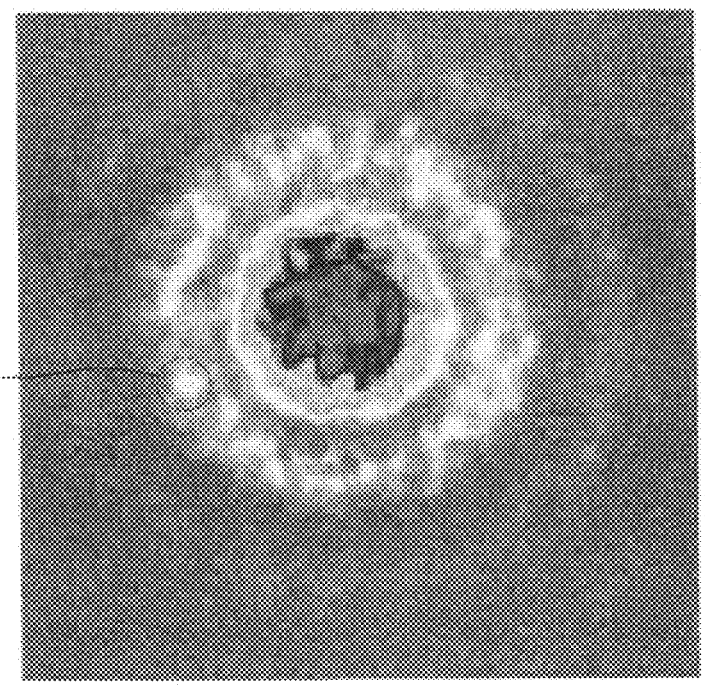

FIGS. 4 and 5 illustrate images showing diffraction patterns when haze is not generated and is generated, respectively, according to an exemplary embodiment. Referring to FIG. 4, when haze is not generated, the diffraction pattern is almost constant, except for a slight distortion A due to aberration of an optical system included in the haze monitoring system. Referring to FIG. 5, when haze is generated, the diffraction pattern in FIG. 5 is distorted, i.e., speckles B appear due to haze. This may be clearly seen by comparing FIGS. 4 and 5.

Figure 6:
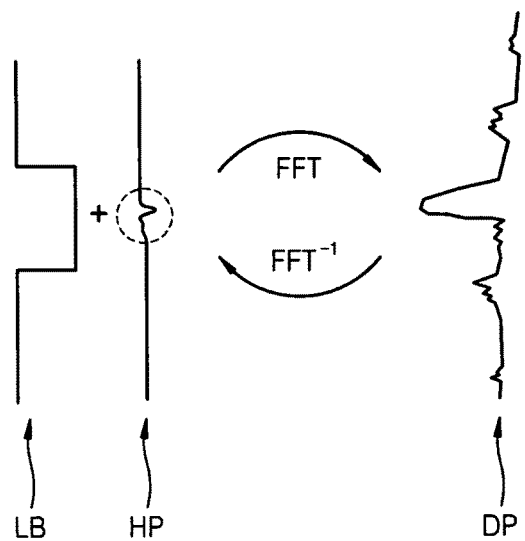
FIG. 6 illustrates a concept of a method of obtaining haze information according to an exemplary embodiment.

FIG. 6 illustrates a concept of a method of obtaining haze information according to an exemplary embodiment. Referring to FIG. 6, when haze is generated in the photomask 10, a light beam LB passing through the mask pattern 12 and a phase HP caused by haze are combined so that a diffraction pattern DP may be generated in the detection unit 130. The light beam LB passing through the mask pattern 12 or a diffraction pattern formed thereby and the diffraction pattern DP generated in the detection unit 130 may be compared to each other. Thus, the haze information, e.g., the location of haze generation or the density of the generated haze, may be obtained in an iteration method of iterating the fast Fourier transform (FFT) and the inverse fast Fourier transform (FFT$^{-1}$).

Figure 7:
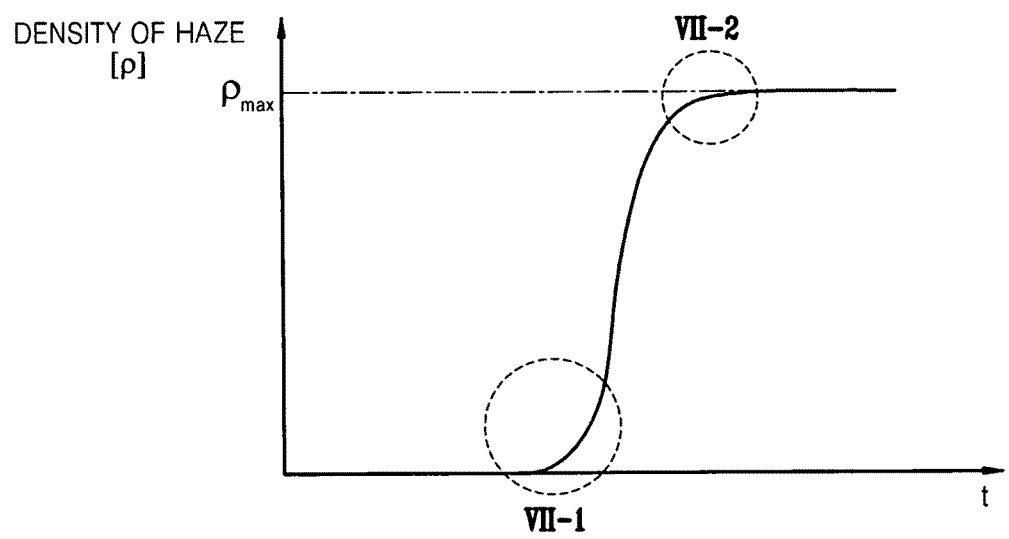
FIG. 7 illustrates a graph showing the density of haze according to an exemplary embodiment.

FIG. 7 illustrates a graph showing the density of haze according to an exemplary embodiment. Referring to FIG. 7, when a light beam is continuously emitted to the photomask 10, haze not initially generated may start to be generated and may gradually increase after a first time point VII-1. Then, from a second time point VII-2, the increase of haze may stop as haze becomes saturated. Accordingly, by obtaining the first time point VII-1 when haze starts to be generated on the photomask 10 being monitored in the haze monitoring system, the time point at which haze would be generated on a photomask manufactured in the same process or in used under the same conditions may be determined. In this case, the time point at which the generation of haze would occur in an actual semiconductor manufacturing process that is not accelerated may be determined by considering the intensity of a light beam used for the haze monitoring system and the frequency of the photomask usage in the lithography process.

Thus, the generation of haze may be prevented in advance by determining an appropriate cleaning time of the photomask in the actual semiconductor manufacturing process based on the obtained haze information including the location, density, or time of haze generation. Also, the haze information may be used to determine a photomask manufacturing process so that the generation of haze may be reduced. That is, an optimal photomask manufacturing process may be determined based on the obtained haze information generated under various process conditions used for the photomask manufacturing process.

Figure 8:
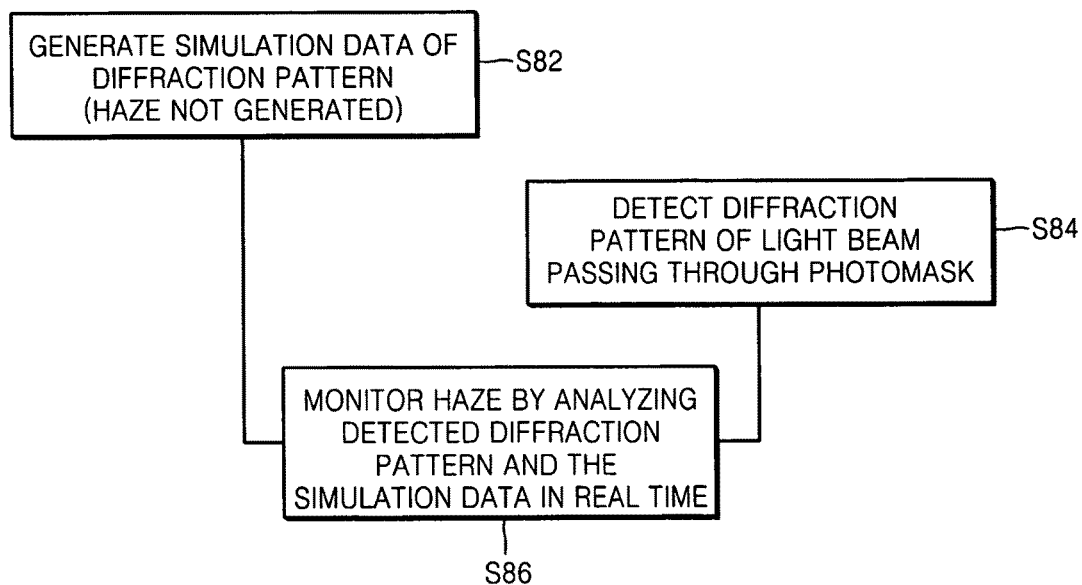
FIG. 8 illustrates a flowchart describing a method of monitoring haze of a photomask according to an exemplary embodiment.

FIG. 8 illustrates a flowchart describing a method of monitoring haze of a photomask according to an exemplary embodiment. Referring to FIG. 8, a diffraction pattern that may be generated in a photomask subject to the haze monitoring may be obtained through a simulation in operation S82. The diffraction pattern obtained through a simulation may be referred to as a simulation data. The simulation data may be a simulation result of the diffraction pattern that may be generated in the photomask, in which haze is yet to be generated. Then, after the photomask to be monitored is installed on the haze monitoring system, a light beam may be continuously emitted to detect a diffraction pattern in operation S84. The detection of the diffraction pattern may be continuously performed in real time for a relatively long time. The monitoring to obtain the haze information may be performed by comparing and analyzing the detected diffraction pattern with the simulation data in real time in operation S86. In addition to the simulation data, information about a mask pattern formed on the photomask may be used for the haze monitoring.

Figure 9:
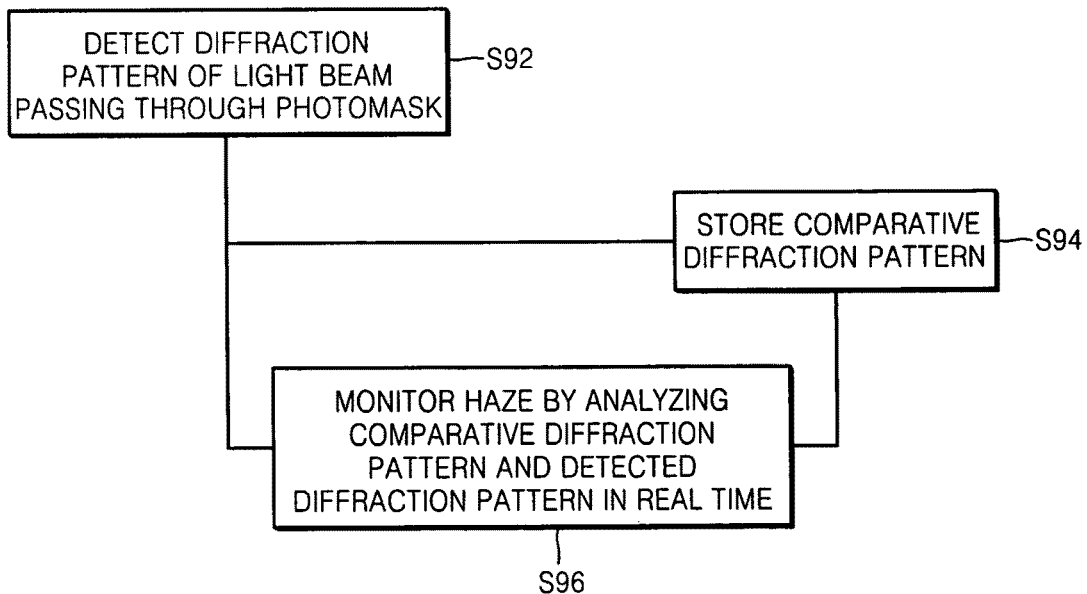
FIG. 9 illustrates a flowchart describing a method of monitoring haze of a photomask according to another exemplary embodiment.

FIG. 9 illustrates a flowchart describing a method of monitoring haze of a photomask according to another exemplary embodiment. Referring to FIG. 9, after a photomask to be monitored is installed on the haze monitoring system, a light beam is continuously emitted to detect a diffraction pattern in operation S92. The diffraction pattern detected at the initial stage, i.e., when the haze is yet to be generated, may be stored as a comparative diffraction pattern in operation S94. The monitoring to obtain the haze information may be performed by analyzing in real time the comparative diffraction pattern and the diffraction pattern by the light beam that is continuously emitted in operation S96.

Example embodiments have been disclosed herein, and although specific terms are employed, they are used and are to be interpreted in a generic and descriptive sense only and not for purpose of limitation. For example, while embodiments may be described in the context of semiconductor manufacturing, it will be appreciated that such embodiments may also be applied to non-semiconductor devices, e.g., optical devices, microelectro mechanical systems (MEMS), etc. Accordingly, it will be understood by those of ordinary skill in the art that various changes in form and details may be made without departing from the spirit and scope of the present invention as set forth in the following claims.

What is claimed is:

1. A system for monitoring haze of a photomask, the system comprising:
    an installation unit in which a photomask is mounted;
    a light emission unit configured to emit a light beam to the photomask in the installation unit;
    a detection unit configured to detect a diffraction pattern of the light beam emitted by the light emission unit and passed through the photomask in the installation unit;
    an analysis unit configured to analyze the diffraction pattern detected by the detection unit, the analysis unit being configured to continuously analyze, in real time, haze information with respect to the photomask through which the light beam emitted by the light emission unit passes; and
    a blocking unit arranged between the photomask in the installation unit and the detection unit, the blocking unit being configured to block only a $0^{th}$ order diffraction light emitted by the light emission unit and passing through the photomask.

2. The system as claimed in claim 1, further comprising a light focusing unit arranged between the photomask installed on the installation unit and the light emission unit and focusing the light beam emitted by the light emission unit.

3. The system as claimed in claim 1, further comprising an attenuation unit arranged between the photomask in the installation unit and the detection unit, the attenuation unit being configured to attenuate the light beam emitted by the light emission unit.

4. The system as claimed in claim 1, wherein the haze information includes density, generation position, or generation time of haze generated on the photomask installed on the installation unit.

5. The system as claimed in claim 1, wherein the analysis unit comprises:
    a first storage unit configured to store a comparative diffraction pattern;
    a second storage unit configured to store the diffraction pattern detected by the detection unit; and
    an operation unit configured to analyze haze information by comparing the comparative diffraction pattern stored in the first storage unit and the diffraction pattern stored in the second storage unit.

6. The system as claimed in claim 5, wherein the comparative diffraction pattern is data about a mask pattern formed at the photomask installed on the installation unit or simulation data of a diffraction pattern by the mask pattern.

7. The system as claimed in claim 5, wherein the comparative diffraction pattern is a detected diffraction pattern initially detected by the detection unit.

8. The system as claimed in claim 5, wherein the operation unit is configured to compare the comparative diffraction pattern and the diffraction pattern detected by the detection unit and analyzes the haze information in an iteration method using fast Fourier transform (FFT) and inverse fast Fourier transform ($FFT^{-1}$).

9. The system as claimed in claim 1, further comprising a light focusing unit configured to focus the light beam output from the light emission unit onto the photomask in the installation unit.

10. The system as claimed in claim 9, further comprising an attenuation unit arranged between the photomask in the installation unit and the detection unit, the attenuation unit being configured to attenuate the light beam emitted by the light emission unit.

11. The system as claimed in claim 1, wherein the analysis unit is configured to continuously analyze, in real time, the diffraction pattern during light emission by the light emission unit.

12. The system as claimed in claim 11, wherein the analysis unit is configured to repeatedly analyze the diffraction pattern at constant intervals, a length of the interval being tens of seconds to several minutes, and a length of the light emission being tens of hours.

13. The system as claimed in claim 1, wherein the analysis unit is configured to analyze the diffraction pattern for a predetermined period of time, a length of the predetermined period of time being several second to tens of seconds.

14. The system as claimed in claim 13, wherein the analysis unit is configured to repeatedly analyze the diffraction pattern at constant intervals, a length of one interval between two predetermined periods of time being tens of seconds to several minutes.

15. A system for determining a lithography process using a photomask in a lithographic device, the system comprising:
- a monitor light emitter configured to output light to the photomask in the lithographic device, light output by the monitor light emitter having a higher intensity than light used in the lithography process;
- a detection unit configured to detect a diffraction pattern of light having passed through the photomask; and
- an analysis unit configured to analyze the diffraction pattern detected by the detection unit, the analysis unit being configured to continuously analyze, in real time, haze information with respect to the photomask during light emission by the light emission by the monitor light emitter.

16. The system as claimed in claim 15, wherein the monitor light emitter includes a lens configured to focus to focus the light on to the photomask.

17. The system as claimed in claim 15, wherein the analysis unit is configured to determine the lithographic process based on operating parameters of the lithographic device relative to monitoring parameters.

18. The system as claimed in claim 17, wherein the analysis unit is configured to determine an appropriate cleaning time in the lithographic process.

19. The system as claimed in claim 15, further comprising a blocking unit arranged between the photomask and the detection unit, the blocking unit configured to block $0^{th}$ order diffraction light output from the photomask.

20. The system as claimed in claim 15, wherein the analysis unit comprises:
- a first storage unit configured to store a comparative diffraction pattern;
- a second storage unit configured to store the diffraction pattern detected by the detection unit; and
- an operation unit configured to analyze haze information by comparing the comparative diffraction pattern stored in the first storage unit and the diffraction pattern stored in the second storage unit.

* * * * *